US012772571B2

(12) United States Patent
Jung et al.

(10) Patent No.: US 12,772,571 B2
(45) Date of Patent: Oct. 20, 2026

(54) SEMICONDUCTOR DEVICE

(71) Applicant: SAMSUNG ELECTRONICS CO., LTD., Suwon-si (KR)

(72) Inventors: Jinwoo Jung, Suwon-si (KR); Kyoungil Do, Suwon-si (KR); Jooyoung Song, Suwon-si (KR); Chanhee Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 417 days.

(21) Appl. No.: 18/582,871

(22) Filed: Feb. 21, 2024

(65) Prior Publication Data

US 2024/0421149 A1 Dec. 19, 2024

(30) Foreign Application Priority Data

Jun. 19, 2023 (KR) ........................ 10-2023-0078162

(51) Int. Cl.
*H10D 62/10* (2025.01)
*H10D 84/00* (2025.01)
(Continued)

(52) U.S. Cl.
CPC ......... *H10D 89/713* (2025.01); *H10D 62/106* (2025.01); *H10D 84/135* (2025.01); *H10D 84/617* (2025.01)

(58) Field of Classification Search
None
See application file for complete search history.

(56) References Cited

U.S. PATENT DOCUMENTS 7,589,944 B2 9/2009 Mergens et al.
8,030,683 B2 10/2011 Sawahata
(Continued)

FOREIGN PATENT DOCUMENTS

CN 111668209 A 9/2020

OTHER PUBLICATIONS

Extended European Search Report in European Appln. No. 24165548.9, mailed on Sep. 5, 2024, 9 pages.
(Continued)

*Primary Examiner* — Xiaoming Liu
(74) *Attorney, Agent, or Firm* — Fish & Richardson P.C.

(57) ABSTRACT

A semiconductor device includes a substrate doped with first conductivity-type impurities, a first well doped with second conductivity-type impurities different from the first conductivity-type impurities, first active regions in the first well, the first active regions being doped with the first conductivity-type impurities and connected to a first pad through a first interconnection, second active regions outside the first well, the second active regions being doped with the second conductivity-type impurities and connected to a second pad through a second interconnection, third active regions around the first active regions in the first well and doped with the second conductivity-type impurities, and fourth active regions around the second active regions outside the first well and doped with the first conductivity-type impurities, wherein at least one of the third active regions and at least one of the fourth active regions are electrically connected to each other through a third interconnection.

20 Claims, 18 Drawing Sheets

(51) Int. Cl.
*H10D 84/60* (2025.01)
*H10D 89/60* (2025.01)

(56) References Cited

U.S. PATENT DOCUMENTS

| | | | | |
|---|---|---|---|---|
| 10,629,586 | B2 | 4/2020 | Paul et al. | |
| 10,833,064 | B2 | 11/2020 | Lin et al. | |
| 2005/0195540 | A1* | 9/2005 | Streibl | H10D 89/711 361/100 |
| 2015/0236011 | A1 | 8/2015 | Wang et al. | |
| 2017/0098645 | A1 | 4/2017 | Su et al. | |
| 2021/0359511 | A1* | 11/2021 | Xu | H02H 9/046 |
| 2022/0208751 | A1 | 6/2022 | Chang et al. | |
| 2022/0337055 | A1 | 10/2022 | Salcedo et al. | |
| 2023/0238454 | A1* | 7/2023 | Langguth | H02H 9/046 361/303 |

OTHER PUBLICATIONS

Sun et al., "Silicon-Controlled Rectifier for Electrostatic Discharge Protection Solutions With Minimal Snapback and Reduced Overshoot Voltage", IEEE Electron Device Letters, May 1, 2015, 36(5):424-426.

* cited by examiner

III-III'

IV-IV'

V-V'

VI-VI'

SEMICONDUCTOR DEVICE

CROSS-REFERENCE TO RELATED APPLICATION

This application claims benefit of priority to Korean Patent Application No. 10-2023-0078162, filed on Jun. 19, 2023, in the Korean Intellectual Property Office, the disclosure of which is incorporated herein by reference in its entirety.

BACKGROUND

1. Field

Embodiments relate to a semiconductor device.

2. Description of the Related Art

A semiconductor device may include a plurality of semiconductor elements, and a portion of the plurality of semiconductor elements may include a receiving circuit and a transmitting circuit for transmitting and receiving signals to and from other external semiconductor devices. The receiving circuit and the transmitting circuit may be connected to a pad for transmitting and receiving signals. In order to protect semiconductor elements from electrostatic discharge (ESD) that may occur in a pad, a receiving circuit, a transmitting circuit, and the like may be connected to an ESD protection circuit. In order to effectively protect semiconductor elements, it is necessary to implement an ESD protection circuit operating at an appropriate trigger voltage.

SUMMARY

According to an aspect of embodiments, there is provided a semiconductor device including a substrate doped with first conductivity-type impurities, a first well region formed in the substrate and doped with second conductivity-type impurities, different from the first conductivity-type impurities, a plurality of first active regions disposed in the first well region, doped with the first conductivity-type impurities, and connected to a first pad through a first interconnection pattern, a plurality of second active regions disposed on an outside of the first well region in the substrate, doped with the second conductivity-type impurities, and respectively connected to a second pad through a second interconnection pattern, a plurality of third active regions disposed around the plurality of first active regions in the first well region and doped with the second conductivity-type impurities, and a plurality of fourth active regions disposed around the plurality of second active regions outside the first well region of the substrate and doped with the first conductivity-type impurities. At least one of the plurality of third active regions and at least one of the plurality of fourth active regions may be electrically connected to each other through a third interconnection pattern.

According to another aspect of embodiments, there is provided a semiconductor device including a substrate doped with first conductivity-type impurities, a first well region and a second well region formed in the substrate and doped with second conductivity-type impurities, different from the first conductivity-type impurities, a plurality of first active regions disposed in the first well region, doped with the first conductivity-type impurities, and respectively connected to a first pad through a first interconnection pattern, a plurality of second active regions disposed in the second well region, doped with the second conductivity-type impurities, and connected to a second pad through a second interconnection pattern, a plurality of third active regions disposed around the plurality of first active regions in the first well region and doped with the second conductivity-type impurities, a plurality of fourth active regions disposed between the first well region and the second well region in the substrate and doped with the first conductivity-type impurities, a plurality of fifth active regions disposed between the first well region and the second well region in the substrate and doped with the second conductivity-type impurities, and a plurality of sixth active regions disposed around the plurality of second active regions in the second well region and doped with the first conductivity-type impurities. At least one of the plurality of third active regions and at least one of the plurality of fourth active regions may be electrically connected to each other through a third interconnection pattern. At least one of the plurality of fifth active regions and at least one of the plurality of sixth active regions may be electrically connected to each other through a fourth interconnection pattern.

According to yet another aspect of embodiments, there is provided a semiconductor device including a first pad to which a signal is input and output, a second pad to which a reference voltage is supplied, a PNP transistor including a first emitter connected to the first pad, a first collector, and a first base, and an NPN transistor including a second emitter connected to the second pad, a second collector connected to the first base, and a second base connected to the first collector. The first base may be connected to the second base and connected to a third pad to which a power supply voltage is supplied through a first diode.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, preferred example embodiments of embodiments will be described with reference to the accompanying drawings.

Figure 1:
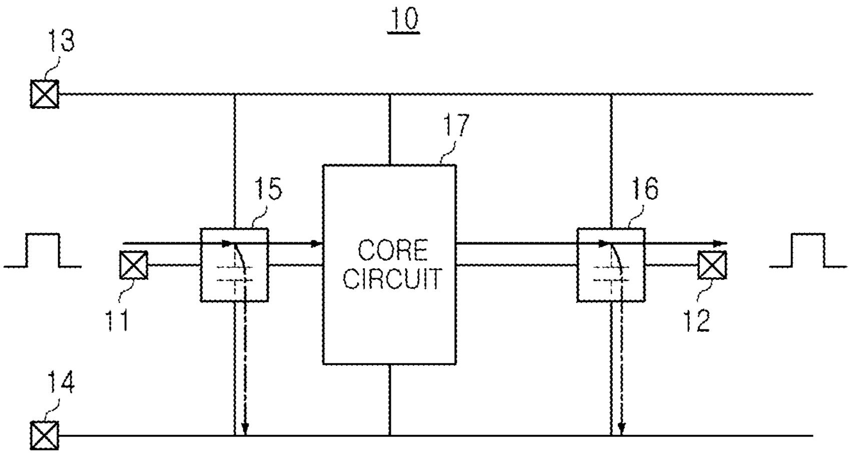
FIG. 1 is a schematic block diagram illustrating a semiconductor device according to an example embodiment.

FIG. 1 is a schematic block diagram illustrating a semiconductor device according to an example embodiment.

Referring to FIG. 1, a semiconductor device 10 according to an example embodiment may include signal pads 11 and 12, power pads 13 and 14, a receiving circuit 15, a transmitting circuit 16, and a core circuit 17. The semiconductor device 10 may exchange signals with other external semiconductor devices through the signal pads 11 and 12. For example, the receiving circuit 15 may receive an external input signal through the input pad 11, among the signal pads 11 and 12, and the transmitting circuit 16 may transmit an external output signal through the output pad 12, among the signal pads 11 and 12.

Each of the receiving circuit 15, the transmitting circuit 16, and the core circuit 17 may include a plurality of semiconductor elements. The receiving circuit 15 may include a receiver, and the transmitting circuit 16 may include a driving circuit. The core circuit 17 may include various circuits necessary for the semiconductor device 10 to provide predetermined functions, e.g., a central processing unit (CPU), a graphics processing unit (GPU), an image signal processor (ISP), a neural processing unit (NPU), a modem, a cache memory, and the like.

The receiving circuit 15 may process an external input signal input to the input pad 11 and transmit the external input signal to the core circuit 17. The transmitting circuit 16 may process a signal received from the core circuit 17 to generate an external output signal, and may transmit the external output signal through the output pad 12. In an example embodiment, each of the external input signal and the external output signal may be a signal having a predetermined frequency, as illustrated in FIG. 1.

A power supply voltage VDD and a reference voltage VSS required for an operation of each of the receiving circuit 15, the transmitting circuit 16, and the core circuit 17 may be input to the power pads 13 and 14. For example, the power supply voltage VDD may be input to a first power pad 13, and the reference voltage VSS having a level lower than that of the power supply voltage VDD may be input to a second power pad 14.

A high voltage caused by ESD or the like may be applied to at least a portion of the pads 11 to 14 of the semiconductor device 10. For example, under an ESD event condition in which a high voltage is applied to at least one of the signal pads 11 and 12 due to ESD or the like, a highly large amount of current may flow through semiconductor elements included in the receiving circuit 15, the transmitting circuit 16, and the like. As a result, the semiconductor elements may be damaged. In an example embodiment, an ESD event may occur in a situation in which a body is in close proximity to at least one of the pads 11 to 14.

In order to prevent damage to the semiconductor elements that may occur under the ESD event condition, the receiving circuit 15, the transmitting circuit 16, and the like may include an ESD protection circuit providing a current movement path.

The ESD protection circuit may provide a path through which current, flowing into the semiconductor device 10, flows under the ESD event condition. In an ideal case, current generated by static electricity around the semiconductor device 10 and flowing into the signal pads 11 and 12 may exit to the second power pad 14 by the ESD protection circuit.

For example, the ESD protection circuit may be implemented as a silicon-controlled rectifier (SCR) circuit including a PNP transistor and an NPN transistor. The SCR circuit may have a trigger voltage determined depending on characteristics of the PNP transistor and the NPN transistor. When a potential difference between static electricity flowing into the signal pads 11 and 12 and the second power pad 14 is higher than the trigger voltage, static electricity may flow to the second power pad 14 through the ESD protection circuit.

When the ESD protection circuit is triggered due to an avalanche breakdown, the trigger voltage may be higher than the breakdown voltage level. The trigger voltage, higher than the breakdown voltage level, may have difficulty in effectively protecting internal semiconductor elements of the semiconductor device 10 from ESD occurring in the signal pads 11 and 12.

According to an example embodiment, a base of the PNP transistor of the ESD protection circuit and a base of the NPN transistor may be electrically connected to each other through an interconnection pattern or the like. The ESD protection circuit may be triggered, as current caused by ESD flows through an electrical connection between the bases. Accordingly, the trigger voltage of the ESD protection circuit may be lowered, and the internal semiconductor elements of the semiconductor device 10 may be effectively protected from ESD.

Figure 2:
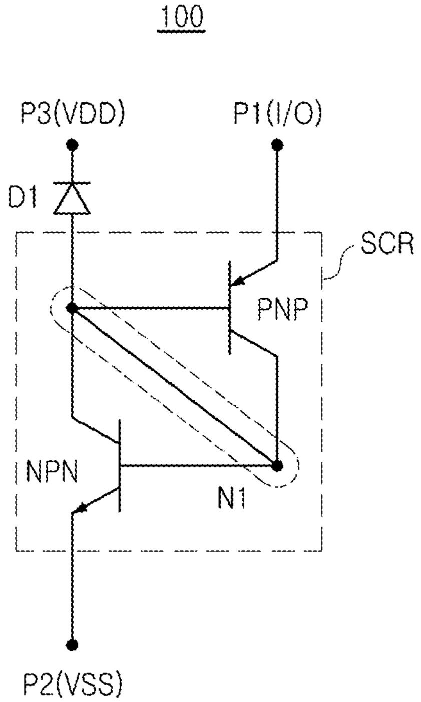
FIG. 2 is a schematic diagram illustrating an ESD protection circuit included in a semiconductor device according to an example embodiment.

FIG. 2 is a schematic diagram illustrating an ESD protection circuit included in a semiconductor device according to an example embodiment.

Referring to FIG. 2, the ESD protection circuit 100 according to an example embodiment may include a PNP transistor PNP, an NPN transistor NPN, and a first diode D1.

An emitter of the PNP transistor PNP may be connected to a first pad P1 to which a signal is input or output. In addition, an emitter of the NPN transistor NPN may be connected to a second pad P2 to which a reference voltage is applied. For example, the reference voltage may be a ground voltage VSS.

A base of the PNP transistor PNP may be connected to a collector of the NPN transistor NPN. In addition, a collector of the PNP transistor PNP may be connected to a base of the NPN transistor NPN.

According to an example embodiment, the base of the PNP transistor PNP and the base of the NPN transistor NPN may be electrically connected to each other. Referring to FIG. 2, the base of the PNP transistor PNP and the base of the NPN transistor NPN may be connected to a first node N1.

Current, caused by the ESD occurring in the first pad P1, may flow to the first node N1 through a PN junction of the PNP transistor PNP, and the current may be applied to the base of the NPN transistor NPN, such that an SCR circuit including the PNP transistor PNP and the NPN transistor NPN may be triggered. Accordingly, the SCR circuit may be triggered before avalanche breakdown occurs, and a trigger voltage of the ESD protection circuit 100 may be lower than a breakdown voltage level.

In addition, according to an example embodiment, the base of the PNP transistor PNP may be connected to a third pad P3 to which a power supply voltage VDD is applied through the first diode D1. Accordingly, a current path may be formed between the first pad P1 and the third pad P3 due to ESD occurring in the first pad P1. A current path formed from the first pad P1 to the third pad P3 may improve turn-on performance of the ESD protection circuit 100 and reduce parasitic capacitance appearing in the first pad P1.

Figure 3:
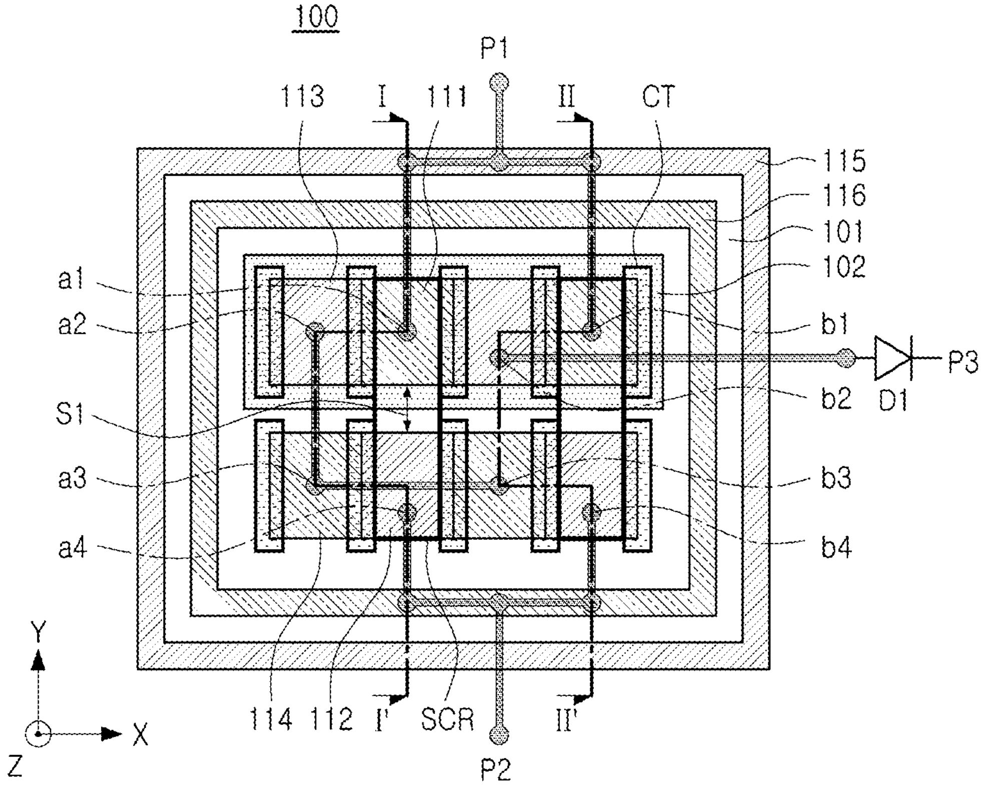
FIG. 3 is a diagram illustrating a structure of an ESD protection circuit included in a semiconductor device according to an example embodiment.
Figure 4:
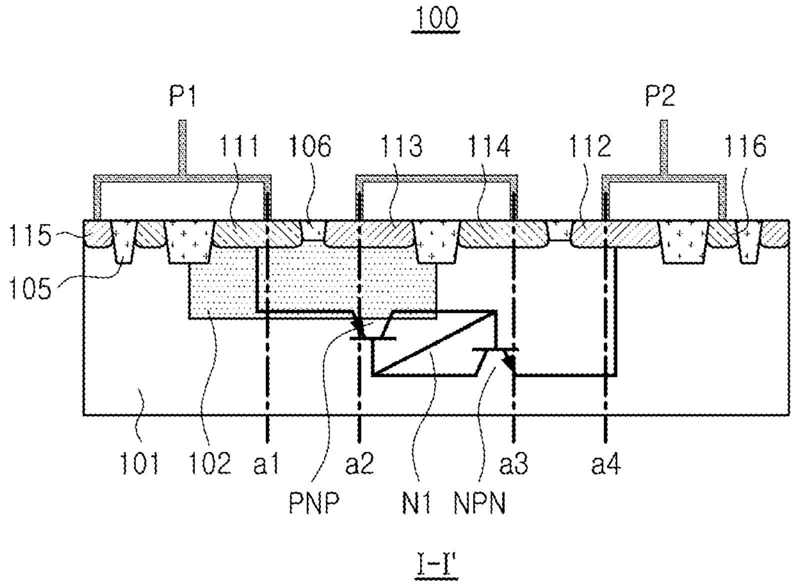
FIG. 4 is a cross-sectional view taken along line I-I' of FIG. 3.
Figure 5:
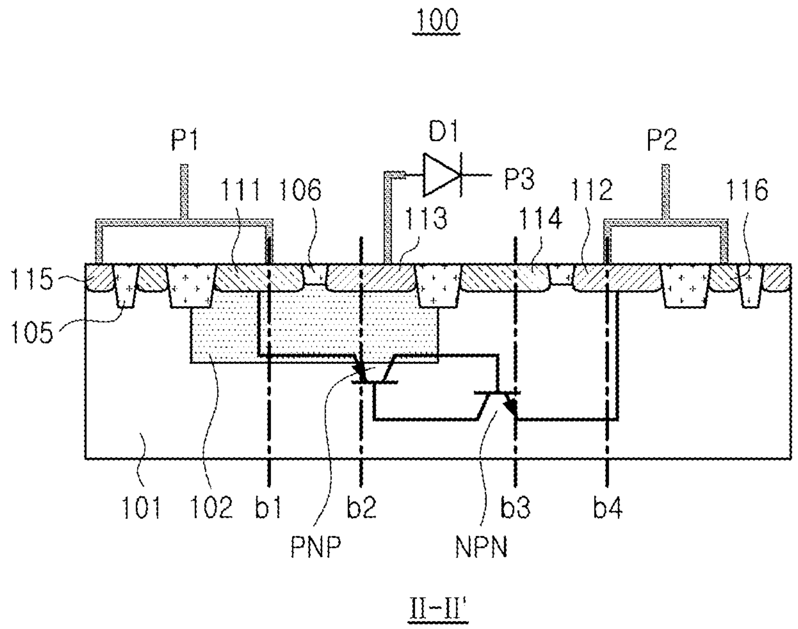
FIG. 5 is a cross-sectional view taken along line II-II' of FIG. 3.

FIG. 3 is a diagram illustrating a structure of an ESD protection circuit included in a semiconductor device according to an example embodiment. FIG. 4 is a cross-sectional view taken along line I-I' of FIG. 3. FIG. 5 is a cross-sectional view taken along line II-II' of FIG. 3.

FIGS. 3 to 5 may be one of examples in which the ESD protection circuit 100 of FIG. 2 is implemented. Referring to FIGS. 3 to 5, a first well region 102 may be formed in a substrate 101. The substrate 101 may be doped with first conductivity-type impurities, and the first well region 102 may be doped with second conductivity-type impurities, different from the first conductivity-type impurities. The first conductivity-type impurities may be P-type impurities, and the second conductivity-type impurities may be N-type impurities. Referring to FIG. 3, the first well region 102 may extend (e.g., lengthwise) in a first direction X, parallel to an upper surface of the substrate 101.

Referring to FIGS. 3 to 5, in the substrate 101 and the first well region 102, a plurality of active regions 111 to 114 and element isolation films 105 and 106, isolating the plurality of active regions 111 to 114 from each other, may be formed. Referring to FIG. 3, first active regions 111 and third active regions 113 may be alternately disposed in the first well region 102 in a first direction X. In addition, the second active regions 112 and the fourth active regions 114 may be alternately disposed in the substrate 101 in the first direction X. The first active regions 111 and the second active regions 112 may have the same position in the first direction X, and may be spaced apart from each other in a second direction Y intersecting the first direction X. In addition, the third active regions 113 and the fourth active regions 114 may have the same position in the first direction X, and may be spaced apart from each other in the second direction Y.

The first active region 111 and the fourth active region 114 may be doped with first conductivity-type impurities and may have an impurity concentration higher than that of the substrate 101. The second active region 112 and the third active region 113 may be doped with second conductivity-type impurities and may have an impurity concentration higher than that of the first well region 102.

Referring to FIGS. 4 and 5, a first element isolation film 105 may be formed around the first to fourth active regions 111 to 114. The first element isolation film 105 is omitted in FIG. 3. However, referring to FIGS. 4 and 5 together, the first element isolation film 105 may be formed in a region in which the substrate 101 and the first well region 102 are visible in FIG. 3, e.g., in a region continuously surrounding each of the well regions 102 in a top view. For example, the first element isolation film 105 may be formed between the first active regions 111 and the second active regions 112 and between the third active regions 113 and the fourth active regions 114.

Referring to FIG. 3, a cut region CT is illustrated between the first active regions 111 and the third active regions 113 and between the second active regions 112 and the fourth active regions 114. A second element isolation film 106 may be formed in the cut region CT. FIGS. 4 and 5 illustrate the second element isolation film 106 formed in the cut region CT.

Referring to FIG. 3, the ESD protection circuit 100 may further include guard rings 115 and 116 surrounding the plurality of active regions 111 to 114. A first guard ring 115 may be doped with second conductivity-type impurities, and a second guard ring 116 may be doped with first conductivity-type impurities.

According to an example embodiment, the first active region 111, the first well region 102, the substrate 101, and the second active region 112 adjacent to each other in the second direction Y may form a PNPN junction, thereby forming a SCR circuit (traced with a bold line in FIG. 3). FIG. 3 illustrates a plurality of SCR circuit regions SCR.

The plurality of SCR circuit regions SCR may share the first well region 102 and the substrate 101. The first active regions 111 included in each of the plurality of SCR circuit regions SCR may be isolated from each other. However, all of the first active regions 111 may be connected to the first pad P1, and may be bonded to the first well region 102. In addition, the second active regions 112 included in each of the plurality of SCR circuit regions SCR may also be isolated from each other. However, all of the second active regions 112 may be connected to the second pad P2, and may be bonded to the substrate 101. Accordingly, the plurality of SCR circuit regions SCR may operate as a single SCR circuit having an enlarged junction area.

A first interval S1 between the first active region 111 and the second active region 112 may determine a trigger voltage of the SCR circuit. For example, as the first interval S1 increases, a distance between a PN junction formed between the first active region 111 and the first well region 102 and a PN junction formed between the substrate 101 and the second active region 112 may increase, thereby increasing the trigger voltage.

An electrical connection between a base of a PNP transistor PNP and a base of an NPN transistor NPN described with reference to FIG. 2 will be described below with reference to FIG. 4. An electrical connection between a base of a PNP transistor PNP and the third pad P3 described with reference to FIG. 2 will be described with reference to FIG. 5.

Referring to FIG. 4, the first active region 111 may provide an emitter of a PNP transistor PNP. In addition, a base of the PNP transistor PNP may be provided by a first well region 102, and a collector of the PNP transistor PNP may be provided by a substrate 101. The emitter of the PNP transistor PNP may be connected to the first pad P1. FIG. 4 also illustrates a connection between the first pad P1 and the first guard ring 115.

The second active region 112 may provide an emitter of an NPN transistor NPN. In addition, a base of the NPN transistor NPN may be provided by the substrate 101 and a collector of the NPN transistor NPN may be provided by the first well region 102. The emitter of the NPN transistor NPN may be connected to the second pad P2. FIG. 4 also illustrates a connection between the second pad P2 and the second guard ring 116.

The PNP transistors PNP and NPN transistors NPN illustrated in FIGS. 4 and 5 may share the first well region 102 and the substrate 101, and thus may operate as a single SCR circuit.

According to an example embodiment, the third active region 113 and the fourth active region 114 may be electrically connected to each other by an interconnection pattern. The third active region 113 may be electrically connected to the first well region 102 and the fourth active region 114 may be electrically connected to the substrate 101, such that the base of the PNP transistor PNP and the base of the NPN transistor NPN may be electrically connected to each other.

The second element isolation film 106 may have a length shorter than that of the first element isolation film 105 in a third direction (e.g., in a thickness direction of the substrate 101), perpendicular to an upper surface of the substrate 101. For example, the first element isolation film 105 may be a deep trench isolation (DTI), and the second element isolation film 106 may be a shallow trench isolation (STI). As the thickness of the second element isolation film 106 decreases, the flow of current in the first active region 111, the first well region 102, and the third active region 113, and the flow of current in the fourth active region 114, the substrate 101, and the second active region 112 may be facilitated.

Referring to FIG. 5, as described with reference to FIG. 4, the first active region 111, the first well region 102, and the substrate 101 may provide the PNP transistor PNP, and the first well region 102, the substrate 101, and the second active region 112 may provide the NPN transistor NPN. According to an example embodiment, the third active region 113 may be electrically connected to the third pad P3 through a first diode D1. The third active region 113 may be electrically connected to the first well region 102, such that the base of the PNP transistor PNP may also be electrically connected to the third pad P3 through the first diode D1.

Figure 6A:
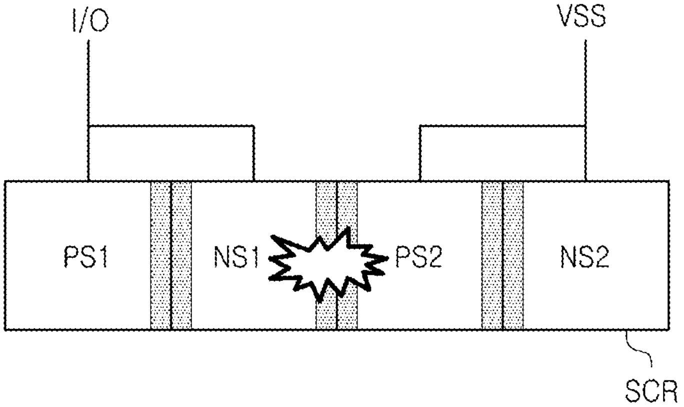
FIGS. 6A and 6B are diagrams illustrating an operation of an ESD protection circuit included in a semiconductor device according to an example embodiment.
Figure 6B:
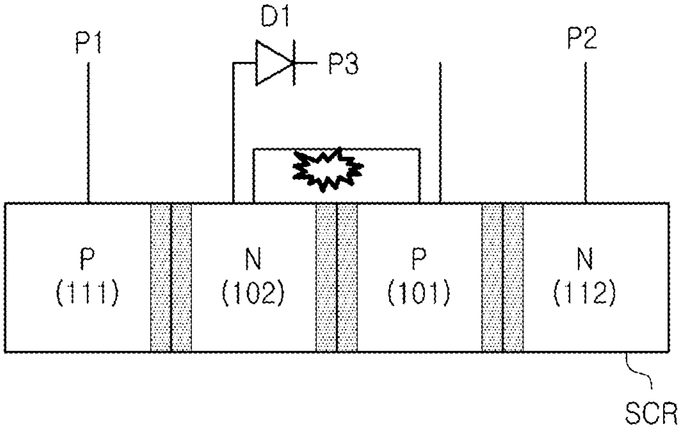
Figure 7:
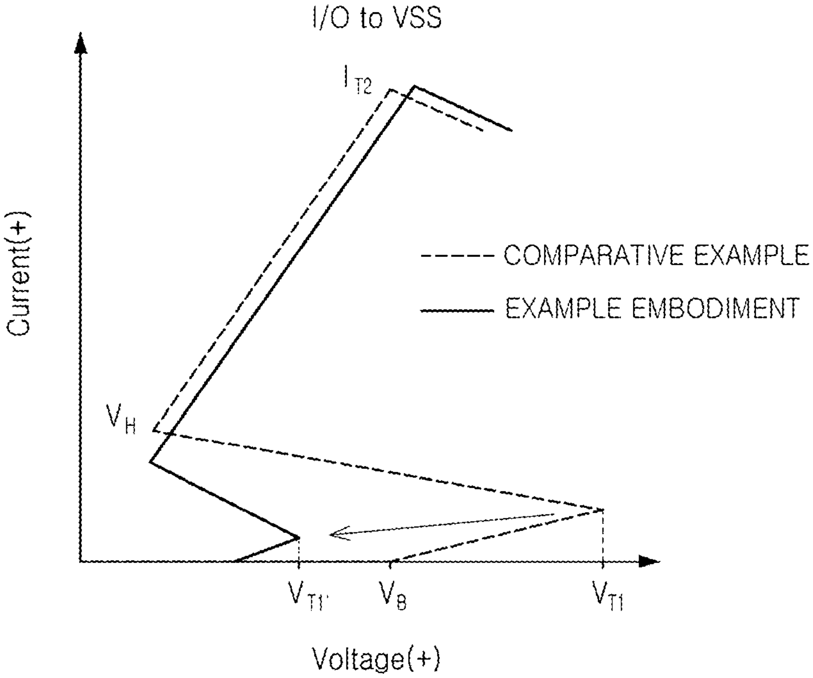
FIG. 7 is a graph illustrating an operation of an ESD protection circuit included in a semiconductor device according to an example embodiment.

FIGS. 6A and 6B are diagrams illustrating an operation of an ESD protection circuit included in a semiconductor device according to an example embodiment. FIG. 7 is a graph illustrating an operation of an ESD protection circuit included in a semiconductor device according to an example embodiment.

FIG. 6A is a schematic diagram illustrating a structure of an ESD protection device according to a comparative example different from an example embodiment. FIG. 6B is a schematic diagram illustrating a structure of an ESD protection device according to an example embodiment.

Referring to FIG. 6A, the ESD protection device according to a comparative example may include an SCR circuit formed by a first P-type structure PS1, a first N-type structure NS1, a second P-type structure PS2, and a second N-type structure NS2 bonded to each other. The first P-type structure PS1 and the first N-type structure NS1 may be connected to a signal pad I/O, and the second P-type structure PS2 and the second N-type structure NS2 may be connected to a ground pad VSS.

According to the comparative example of FIG. 6A, the first N-type structure NS1 and the second P-type structure PS2 may not be electrically connected to each other. Accordingly, the ESD protection device according to the comparative example may be triggered only by the avalanche breakdown.

Referring to the graph of FIG. 7, voltage-current characteristics of the ESD protection device according to the comparative example are illustrated using a broken (dashed) line. The SCR circuit of the ESD protection device may have a breakdown voltage level VB determined depending on characteristics of a PNP transistor and an NPN transistor. Avalanche breakdown may occur at a trigger voltage $V_{T1}$ higher than the breakdown voltage level VB, such that the ESD protection device according to a comparative example may be turned on. As the ESD protection device according to a comparative example is turned on, a large amount of current, caused by ESD, may flow to the ground pad VSS. However, the trigger voltage higher than the breakdown voltage level may have difficulty in effectively protecting internal semiconductor elements from ESD.

Referring to FIG. 6B, the ESD protection device according to an example embodiment may include an SCR circuit configured by the first active region 111, the first well region 102, the substrate 101, and the second active region 112 bonded to each other. The first active region 111 may be connected to the first pad P1. The first well region 102 and the substrate 101 may be electrically connected to each other. The second active region 112 may be connected to the second pad P2. In addition, the first well region 102 may be connected to the third pad P3 through the first diode D1.

According to an example embodiment, the first well region 102 and the substrate 101 may be electrically connected to each other. Thus, the SCR circuit may be triggered, when a potential difference between the first pad P1 and the second pad P2 has a magnitude sufficient to trigger a PN junction formed between the first active region 111 and the first well region 102 and a PN junction formed between the substrate 101 and the second active region 112.

Referring to FIG. 7, voltage-current characteristics of the ESD protection device according to an example embodiment are illustrated using a solid line. The ESD protection device according to an example embodiment may be triggered at a first trigger voltage $V_{T1}'$ lower than the breakdown voltage level VB determined according to characteristics of the PNP transistor and the NPN transistor. For example, when the ESD protection circuit according to a comparative example has a first trigger voltage of about 10 V, the ESD protection circuit according to an example embodiment may have a first trigger voltage of about 2 to 3 V.

When the SCR circuit is triggered once, current may start to flow between the first well region 102 and the substrate 101 even when avalanche breakdown does not occur between the first well region 102 and the substrate 101. The ESD protection device according to an example embodiment may maintain a turn-on state as long as the potential difference between the first pad P1 and the second pad P2 does not fall below a holding voltage VH. When current flowing through the ESD protection device is within trigger current $I_{T2}$, an ESD circuit may allow a large amount of current caused by ESD applied to the first pad P1 to flow to the second pad P2 without being damaged.

According to an example embodiment, the ESD protection device may have reduced trigger voltage, and the ESD protection device may effectively protect a semiconductor device from static electricity applied to the first pad P1. As described with reference to FIG. 3, the trigger voltage may be adjusted depending on the first interval S1 between the first active region 111 and the second active region 112.

Even when the ESD protection device is turned off, the ESD protection device may have parasitic capacitance. Even under a normal condition in which no ESD event occurs, an input signal or an output signal of the signal pad I/O may pass through the ESD protection device. When the ESD protection device has high parasitic capacitance, switching speed of an input/output signal, passing through the ESD protection device, may be reduced, and high-speed input/output signal may be distorted.

According to the comparative example illustrated in FIG. 6A, a reference voltage VSS may be applied to the second P-type structure PS2 and the second N-type structure NS2. Parasitic capacitance, caused by a PN junction formed between the first P-type structure PS1 and the first N-type structure PN1, and parasitic capacitance, caused by an NP junction formed between the first N-type structure PN1 and the second P-type structure PS2, may appear between the signal pad I/O and the reference voltage VSS.

Conversely, according to the example embodiment illustrated in FIG. 6B, a power supply voltage may be applied from the first pad P1 to the third pad P3 connected to the first well region 102. Assuming that the first diode D1 has a sufficiently small amount of parasitic capacitance, only parasitic capacitance, caused by the PN junction formed between the first active region 111 and the first well region 102, may appear between the first pad P1 and the third pad P3. Accordingly, parasitic capacitance, appearing in the first pad P1 according to an example embodiment, may be reduced, and distortion of the high-speed input/output signal may be alleviated.

In addition, according to an example embodiment, when a potential difference between the first pad P1 and the third pad P3 is greater than a threshold voltage of the first diode D1 due to ESD occurring in the first pad P1, the first diode D1 may be triggered. Accordingly, current caused by ESD may be effectively removed through the third pad P3 as well as the SCR circuit. For example, current caused by static electricity may also flow through a power clamp connected between the third pad P3 and the first pad P1.

Figure 8:
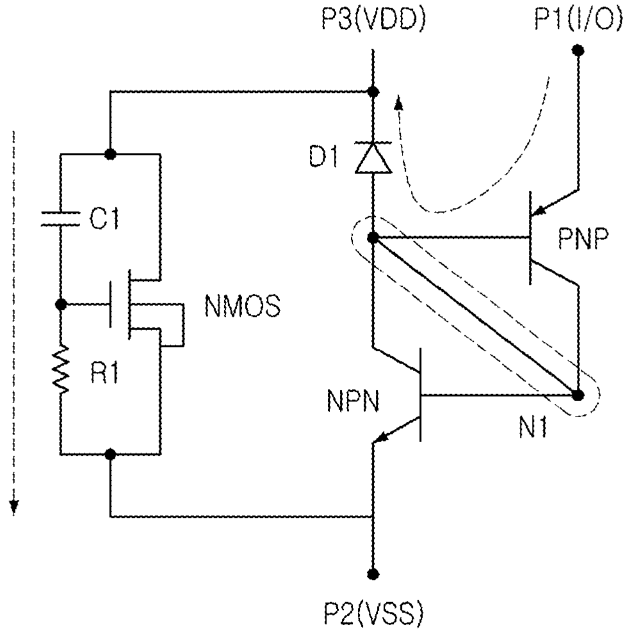
FIG. 8 is a schematic diagram illustrating an ESD protection circuit included in a semiconductor device according to an example embodiment.

FIG. 8 is a schematic diagram illustrating an ESD protection circuit included in a semiconductor device according to an example embodiment.

Referring to FIG. 8, a power clamp may be connected to the third pad P3 and the first pad P1 of the ESD protection circuit, as described with reference to FIG. 2. FIG. 8 is an exemplary structure of the power clamp, and illustrates a structure in which a gate and a source of an NMOS transistor are connected through a first resistor R1, and a drain and a gate are connected through a first capacitor C1.

According to an example embodiment, when a voltage applied to the first pad P1 due to ESD is greater than a sum of a power supply voltage VDD applied to the third pad P3 and a threshold voltage of a first diode D1, the first diode D1 may be turned on. When the first diode D1 is turned on, current caused by ESD may exit to a second pad P2 not only through a SCR circuit but also through the power clamp.

According to an example embodiment, a ESD protection device may remove current caused by ESD occurring in the first pad P1, using the power clamp connected between the third pad P3 and the second pad P2 as well as the SCR circuit connected between the first pad P1 and the second pad P2. Accordingly, internal semiconductor elements may be effectively protected from ESD occurring in the first pad P1.

In addition, a turn-on speed of a general power clamp may be higher than a turn-on speed of the SCR circuit. Accordingly, the ESD protection device may be rapidly turned on by ESD occurring in the first pad P1 to more effectively protect the internal semiconductor elements.

For example, FIGS. 2 to 8 illustrate a case in which only one first diode D1 is connected between a first node N1 and the third pad P3. In another example, a plurality of diodes may be connected in series between the first node N1 and the third pad P3. Depending on the number of diodes connected in series, a voltage condition of the first pad P1 for forming a current path from the first pad P1 to the third pad P3 may vary.

For example, the number of diodes connected between the first node N1 and the third pad P3 may be selected depending on a usage voltage of an input/output signal. The usage voltage of the input/output signal may refer to a maximum voltage in a range of a voltage used for the input/output signal. For example, when the usage voltage of the input/output signal is higher than a sum of a power supply voltage VDD and a threshold voltage of a diode, the input/output signal may leak through the power clamp and the signal may be distorted. Accordingly, the number of diodes may be selected such that the sum of the power supply voltage VDD and the threshold voltage of the diode is higher than the usage voltage.

Figure 9:
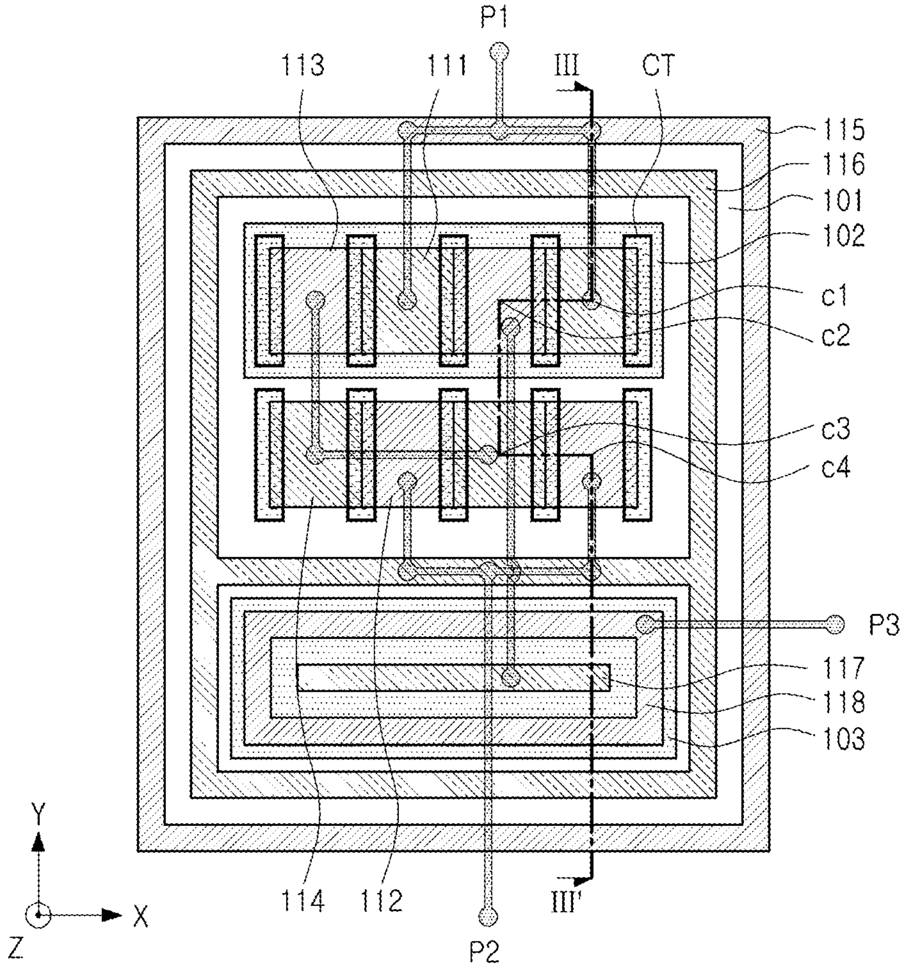
FIG. 9 is a diagram illustrating a structure of an ESD protection circuit included in a semiconductor device according to an example embodiment.
Figure 10:
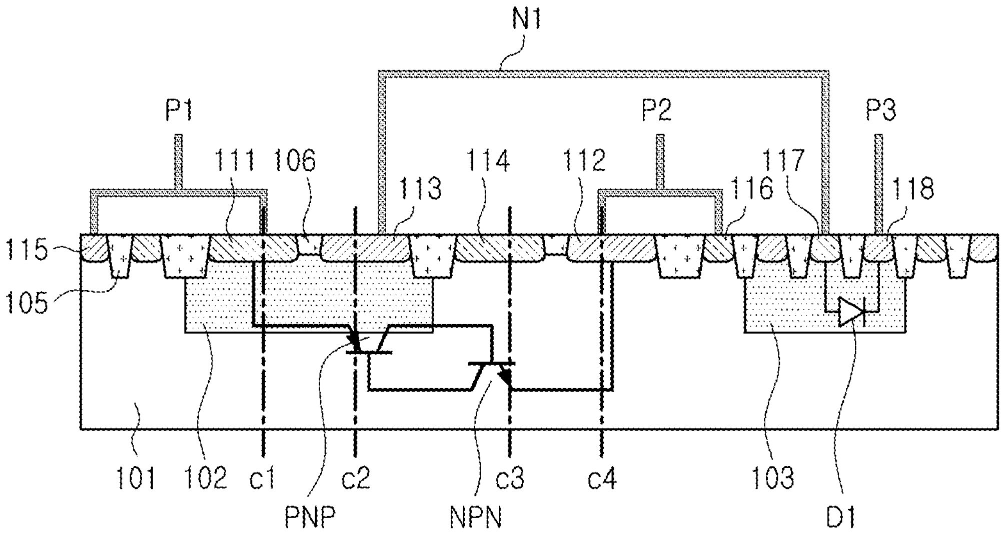
FIG. 10 is a cross-sectional view taken along line III-III' of FIG. 9.

FIG. 9 is a diagram illustrating a structure of an ESD protection circuit included in a semiconductor device according to an example embodiment. FIG. 10 is a cross-sectional view taken along line III-III' of FIG. 9.

An ESD protection circuit 100 illustrated in FIGS. 9 and 10 may correspond to the ESD protection circuit 100 described with reference to FIGS. 2 to 5. The ESD protection circuit 100 of FIGS. 9 and 10 may be an example in which not only a SCR circuit but also a first diode D1 are implemented.

The ESD protection circuit 100 illustrated in FIG. 9 may further include a second well region 103 in addition to the ESD protection circuit 100 illustrated in FIG. 3, and may further include a fifth active region 117 and a sixth active region 118 formed in the second well region 103. In the same manner as the first well region 102, the second well region 103 may be doped with second conductivity-type impurities. The fifth active region 117 may be doped with first conductivity-type impurities, and the sixth active region 118 may be doped with the second conductivity-type impurities.

Referring to FIGS. 9 and 10, the fifth active region 117 may provide an anode of the first diode D1, and the sixth active region 118 may provide a cathode of the first diode D1. The fifth active region 117 may be connected to the third active region 113, and the sixth active region 118 may be connected to the third pad P3. As described with reference to FIGS. 2 to 8, the first diode D1 may reduce parasitic capacitance of the ESD protection circuit and improve turn-on speed of the ESD protection circuit.

Conversely, according to an example embodiment, characteristics of the ESD protection circuit may be adjusted by adjusting a size of the SCR circuit included in the ESD protection circuit. For example, as described with reference to FIG. 8, trigger current $I_{T2}$ may be adjusted.

Figure 11:
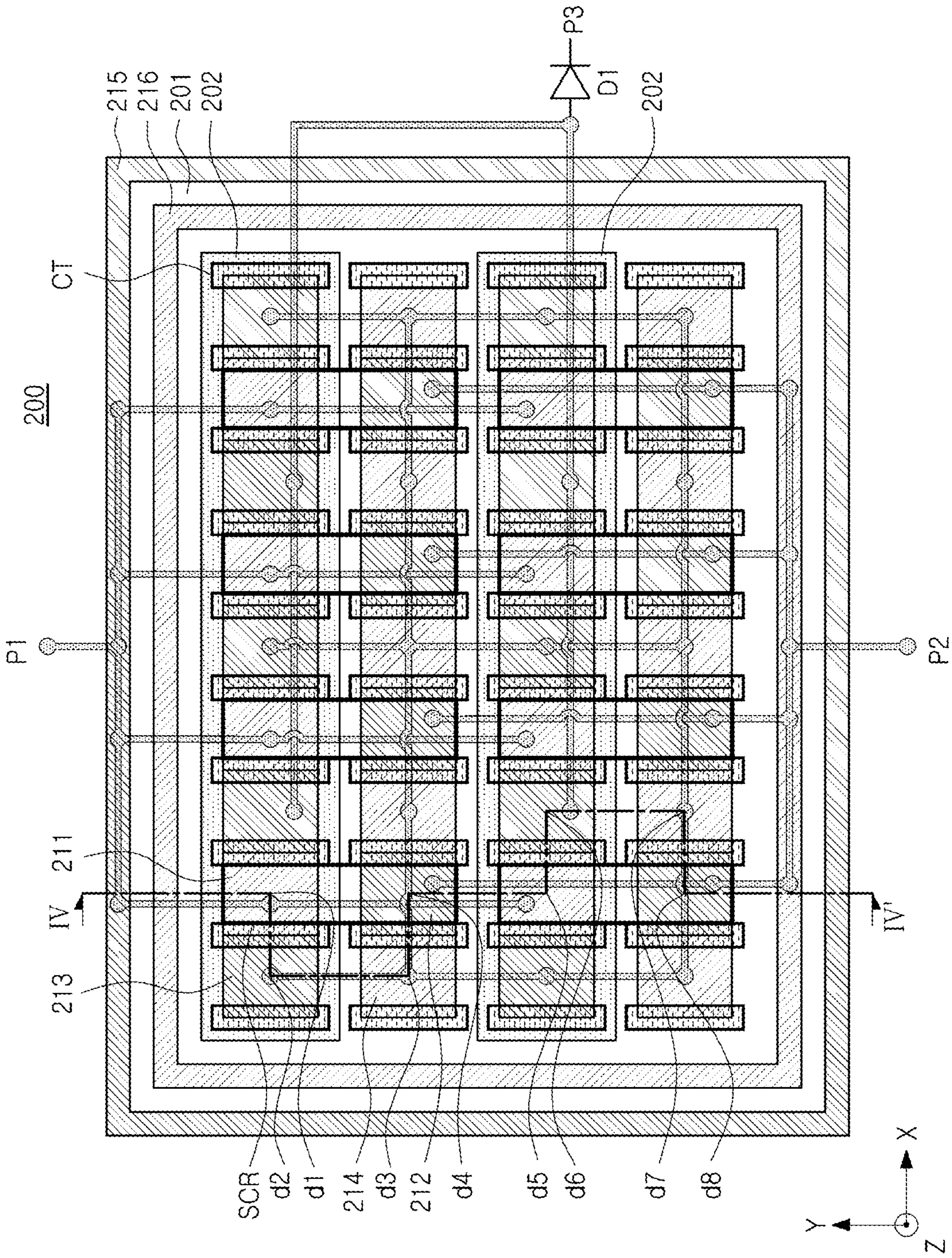
FIG. 11 is a diagram illustrating a structure of an ESD protection circuit included in a semiconductor device according to an example embodiment.
Figure 12:
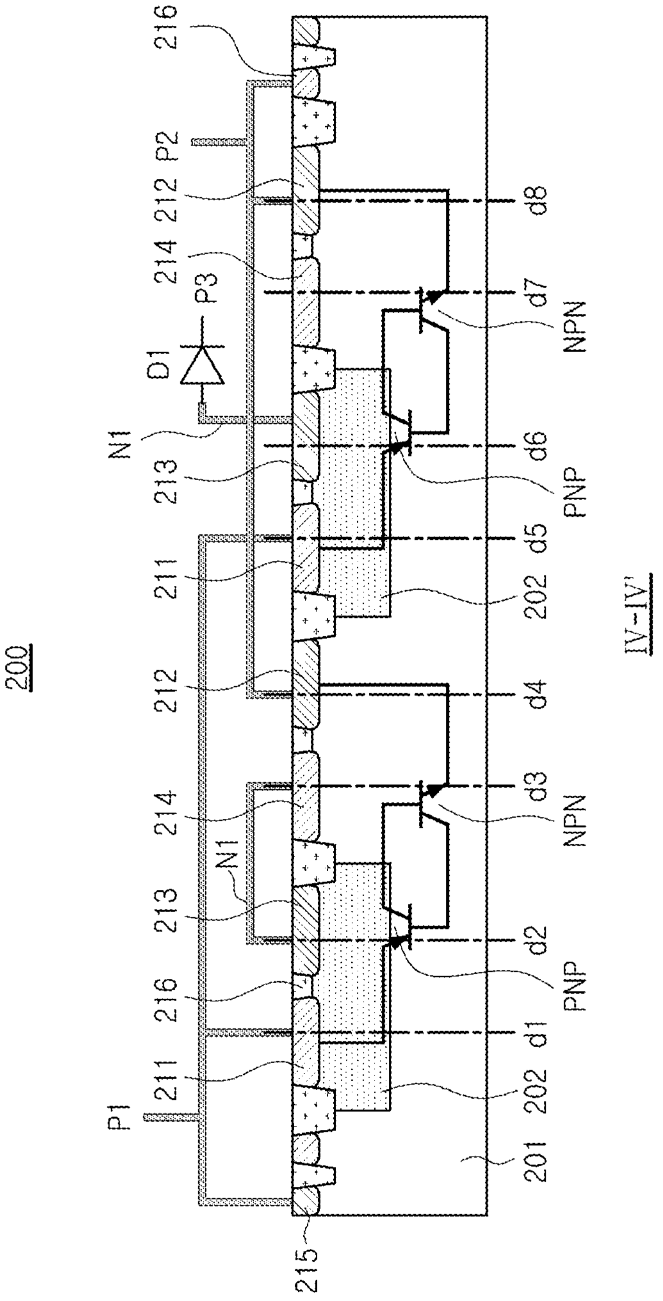
FIG. 12 is a cross-sectional view taken along line IV-IV' of FIG. 11.

FIG. 11 is a diagram illustrating a structure of an ESD protection circuit included in a semiconductor device according to an example embodiment. FIG. 12 is a cross-sectional view taken along line IV-IV' of FIG. 11.

An ESD protection circuit 200 illustrated in FIGS. 11 and 12 may correspond to the ESD protection circuit 100 illustrated in FIG. 2. However, the ESD protection circuit 200 illustrated in FIGS. 11 and 12 may have a size different from that of the ESD protection circuit 100 illustrated in FIGS. 3 to 5.

Referring to FIG. 11, a plurality of first well regions 202 may be formed in a substrate 201. The substrate 201 may be doped with first conductivity-type impurities, and the first well regions 202 may be doped with second conductivity-type impurities different from the first conductivity-type impurities. The first well regions 202 may extend (e.g., lengthwise) in the substrate 201 in the first direction X.

Referring to FIGS. 11 and 12, a plurality of active regions 211 to 214 and an element isolation films 205 and 206, isolating the plurality of active regions 211 to 214 from each other, may be formed in each of the substrate 201 and the first well regions 202. In addition, guard rings 215 and 216 may be formed to surround the first well regions 202 and the plurality of active regions 211 to 214. The plurality of active regions 211 to 214, the element isolation films 205 and 206, and the guard rings 215 and 216 may be disposed on the substrate 201 or the first well regions 202 in a pattern similar to that of the plurality of active regions 111 to 114 and the element isolation films 105 and 106 described above with reference to FIGS. 3 to 5, thereby forming an SCR circuit.

Referring to FIG. 11, the first active region 211, the first well region 202, the substrate 201, and the second active region 212 adjacent to each other in the second direction Y may form an SCR circuit. FIG. 11 illustrates a plurality of SCR circuit regions SCR.

Referring to FIGS. 11 and 12, the plurality of SCR circuit regions SCR may share the substrate 201. In addition, the first active regions 211, isolated from each other, may all be connected to the first pad P1, and a plurality of second active regions 212 separated from each other may all be connected to the second pad P2. Accordingly, the plurality of SCR circuit regions SCR may operate as a single SCR circuit having an enlarged PNPN junction area.

According to an example embodiment, trigger current $I_{T2}$ may be determined depending on the number and area of the first well regions 202 and the plurality of active regions 211 to 214. Specifically, as the number or area of the first well regions 202 and the plurality of active regions 211 to 214 increases, the trigger current $I_{T2}$ may increase.

In some example embodiments, the number and area of the first well regions 202 and the plurality of active regions 211 to 214 may be determined based on a target value of the trigger current $I_{T2}$. For example, the target value may be determined based on ESD performance required by an ESD test model, e.g., a human body model (HBM), a charged device model (CDM), or the like, and the number and area of the first well regions 202 and the plurality of active regions 211 to 214 may be determined such that the trigger current $I_{T2}$ has a value greater than or equal to the target value. According to an example embodiment, internal semiconductor elements of a semiconductor device may be effectively protected from an ESD event, caused by contact between the semiconductor device and a human body, contact between the semiconductor device and a machine, or the like.

The ESD protection circuit 200 may block current caused by ESD from leaking through the substrate 201, thereby more effectively protecting the internal semiconductor elements of the semiconductor device from the ESD event.

Figure 13:
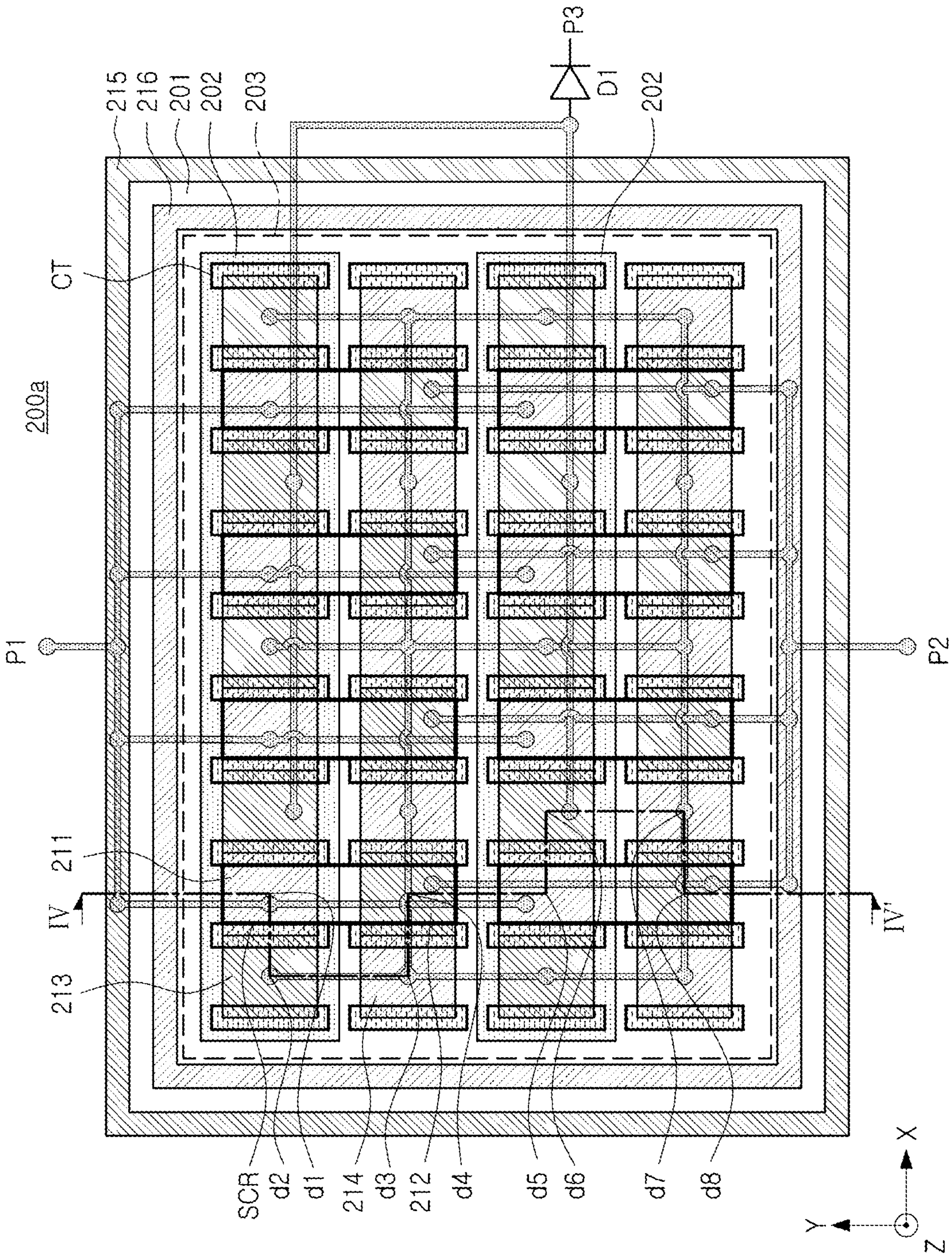
FIG. 13 is a diagram illustrating a structure of an ESD protection circuit included in a semiconductor device according to an example embodiment.
Figure 14:
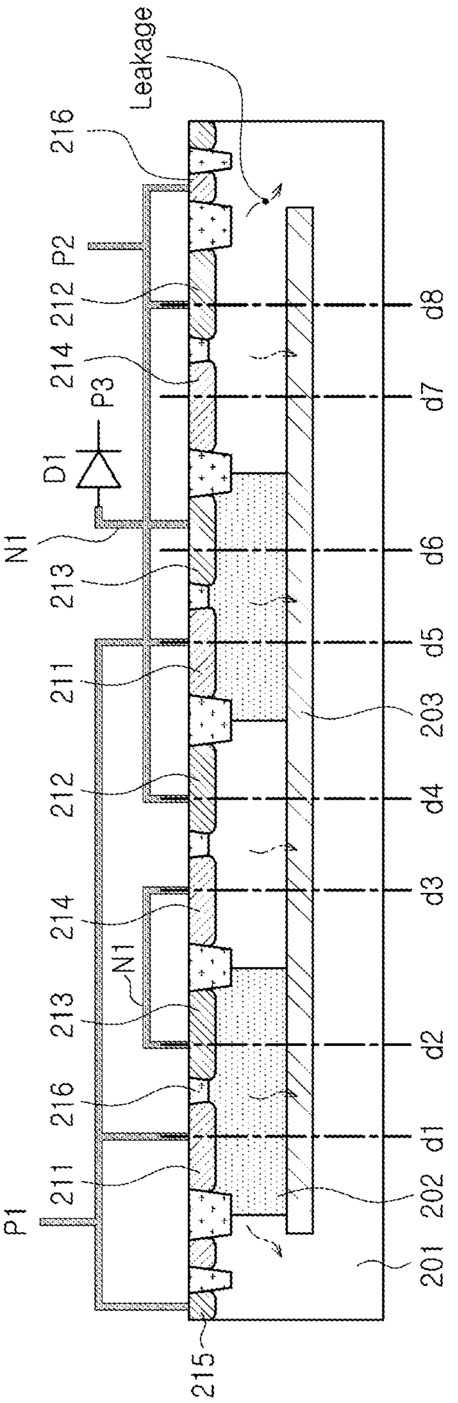
FIG. 14 is a cross-sectional view taken along line IV-IV' of FIG. 13.

FIG. 13 is a diagram illustrating a structure of an ESD protection circuit included in a semiconductor device according to an example embodiment. FIG. 14 is a cross-sectional view taken along line IV-IV' of FIG. 13.

The ESD protection circuit 200*a* illustrated in FIGS. 13 and 14 may be substantially the same as the ESD protection circuit 200 illustrated in FIGS. 11 and 12, with the exception of further including a deep-well region 203. Referring to FIG. 13, the deep-well region 203 may be formed at least (e.g., at least partially) in an internal region defined by the guard rings (e.g., within a region indicated by the dashed frame in FIG. 13), thereby effectively blocking leakage current that is not blocked by the guard rings 215 and 216. The deep-well region 203 may be doped with second conductivity-type impurities, and may be doped at an impurity concentration higher than that of first well regions 202.

Referring to FIG. 14, the deep-well region 203 may be formed below the first well regions 202. For example, the deep-well region 203 may be formed to be adjacent to lower surfaces of the first well regions 202.

As described above, a portion of the PNP transistor PNP and the NPN transistor NPN provided by the ESD protection circuit 200*a* may be provided by the substrate 201. Accordingly, when the ESD protection circuit 200*a* is triggered and current flows through the PNP transistor PNP and the NPN transistor NPN, leakage current may occur through the substrate 201. When the leakage current is not effectively blocked, the leakage current may flow into semiconductor elements sharing the substrate 201 with the ESD protection circuit 200*a*.

According to an example embodiment, current leaking to a side surface of the ESD protection circuit 200*a* may be blocked by the guard rings 215 and 216. In addition, the current leaking to the lower surface of the ESD protection circuit 200*a* may be blocked by the deep-well region 203.

Characteristics of a holding voltage $V_H$ of the ESD protection circuit may be controlled by adjusting an area ratio between a first active region and a second active region.

Figure 15:
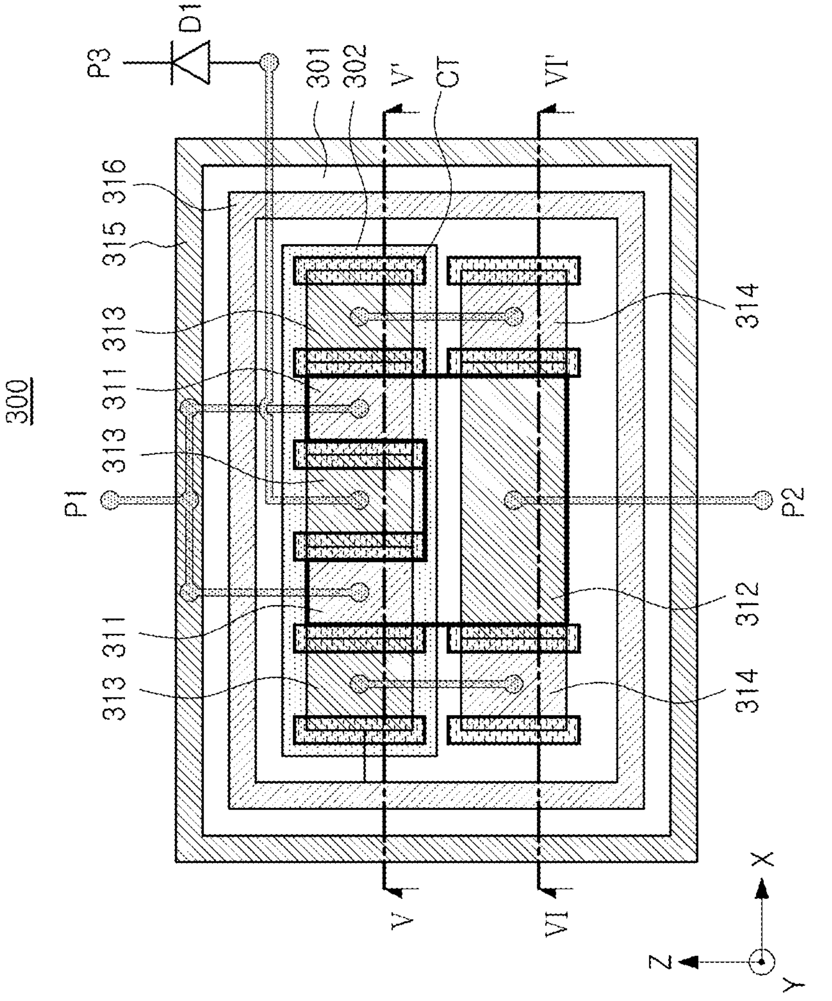
FIG. 15 is a diagram illustrating a structure of an ESD protection circuit included in a semiconductor device according to an example embodiment.
Figure 16A:
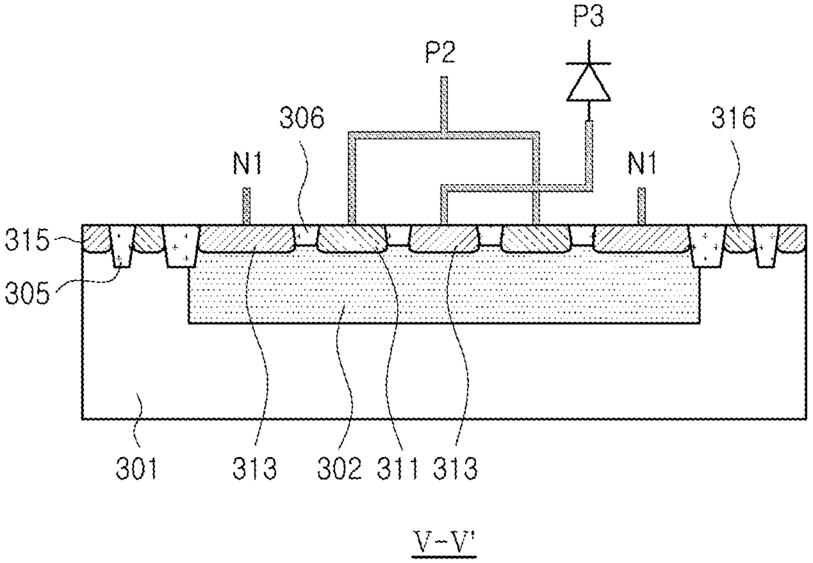
FIGS. 16A and 16B are cross-sectional views taken along lines V-V' and VI-VI' of FIG. 15, respectively.
Figure 16B:
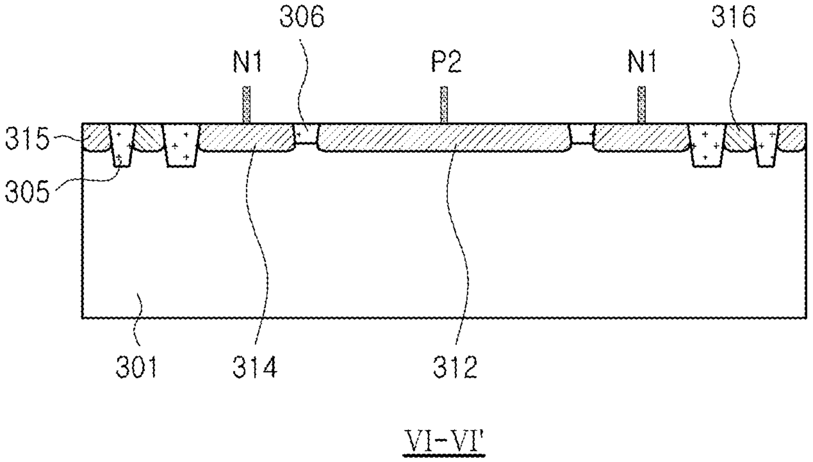

FIG. 15 is a diagram illustrating a structure of an ESD protection circuit included in a semiconductor device according to an example embodiment. FIGS. 16A and 16B are cross-sectional views taken along lines V-V' and VI-VI' of FIG. 15, respectively.

An ESD protection circuit 300 of FIGS. 15, 16A and 16B may correspond to the ESD protection circuit 100 of FIG. 2. However, the ESD protection circuit 300 of FIGS. 15, 16A and 16B may be different from the ESD protection circuit 100 illustrated in FIGS. 3 to 5 in terms of an area ratio between a first active region and a second active region.

Referring to FIGS. 15, 16A, and 16B, a first well region 302 may be formed in a substrate 301. A plurality of active regions 311 to 314 and element isolation films 305 and 306, isolating the plurality of active regions 311 to 314 from each other, may be formed in the substrate 301 and the first well region 302. In addition, guard rings 315 and 316 may be formed in the substrate 301 to surround the first well region 302 and the plurality of active regions 311 to 314.

According to an example embodiment, an SCR circuit may be provided by forming a PNPN junction between the first active regions 311, the first well region 302, the substrate 301, and the second active region 312. In a similar manner to the ESD protection circuit 100 described with reference to FIGS. 3 to 5, the first active regions 311 may provide an emitter of a PNP transistor PNP, and the second active region 312 may provide an emitter of an NPN transistor NPN.

However, when compared to the ESD protection circuit 100 described with reference to FIGS. 3 to 5, in the ESD protection circuit 300, a sum of areas of the first active regions 311 may be different from an area of the second active region 312. For example, FIGS. 15, 16A, and 16B illustrate a case in which a ratio between the sum of the areas of the first active regions 311 and the area of the second active regions 312 is about 2:3.

According to an example embodiment, the holding voltage $V_H$ may be controlled by adjusting an area ratio between the emitter of the PNP transistor PNP and the emitter of the NPN transistor NPN.

Figure 17:
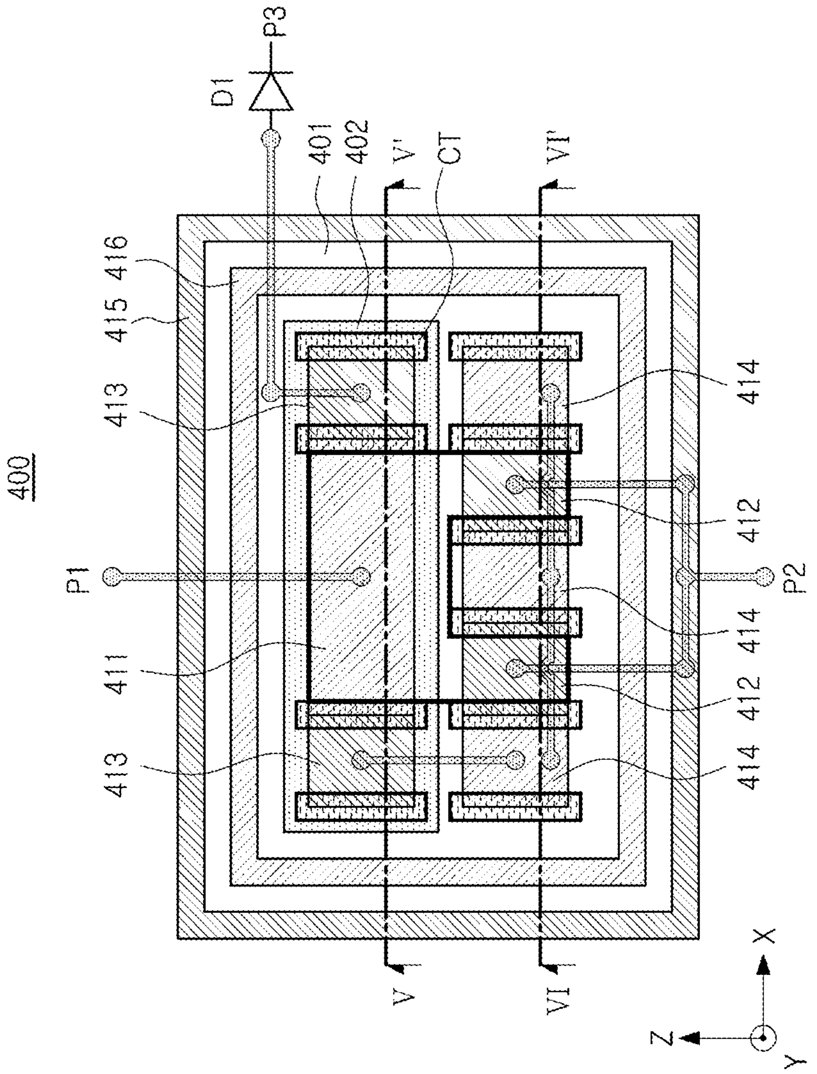
FIG. 17 is a diagram illustrating a structure of an ESD protection circuit included in a semiconductor device according to an example embodiment.
Figure 18A:
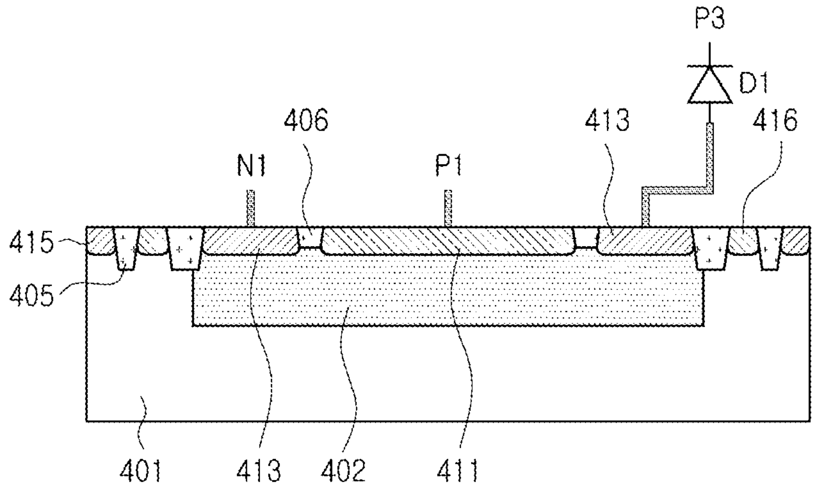
FIGS. 18A and 18B are cross-sectional views taken along lines V-V' and VI-VI' of FIG. 17, respectively.
Figure 18B:
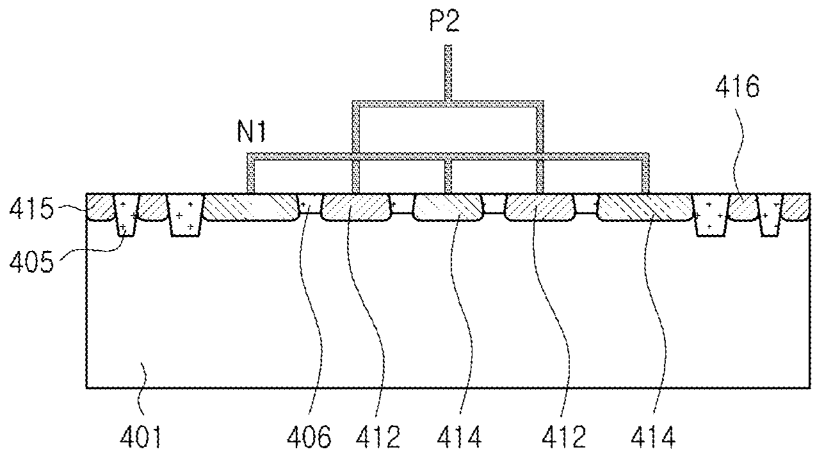

FIG. 17 is a diagram illustrating a structure of an ESD protection circuit included in a semiconductor device according to an example embodiment. FIGS. 18A and 18B are cross-sectional views taken along lines V-V' and VI-VI' of FIG. 17, respectively.

An ESD protection circuit 400 of FIGS. 17, 18A, and 18B may correspond to the ESD protection circuit 100 of FIG. 2. However, the ESD protection circuit 400 of FIGS. 17, 18A, and 18B may be different from the ESD protection circuit 100 illustrated in FIGS. 3 to 5 in terms of an area ratio between a first active region and a second active region.

Referring to FIGS. 17, 18A, and 18B, a first well region 402 may be formed in a substrate 401. A plurality of active regions 411 to 414 and element isolation films 405 and 406, isolating the plurality of active regions 411 to 414 from each other, may be formed in the substrate 401 and the first well region 402. In addition, guard rings 415 and 416 may be formed in the substrate 401 to surround the first well region 402 and the plurality of active regions 411 to 414.

According to an example embodiment, an SCR circuit may be provided by forming a PNPN junction between the first active region 411, the first well region 402, the substrate 401, and the second active regions 412. The first active region 411 may provide an emitter of a PNP transistor PNP, and the second active regions 412 may provide an emitter of an NPN transistor NPN.

When compared with the ESD protection circuit 300 described with reference to FIGS. 15, 16A, and 16B, in an ESD protection circuit 400, an area of the first active region 411 may be greater than a sum of areas of the second active regions 412.

According to an example embodiment, a holding voltage $V_H$ may be controlled by adjusting an area ratio between the emitter of the PNP transistor PNP and the emitter of the NPN transistor NPN.

Characteristics of a first trigger voltage $V_{T1}$ of the ESD protection circuit may be adjusted by adding an element between a base of the PNP transistor PNP and a base of the NPN transistor NPN.

Figure 19:
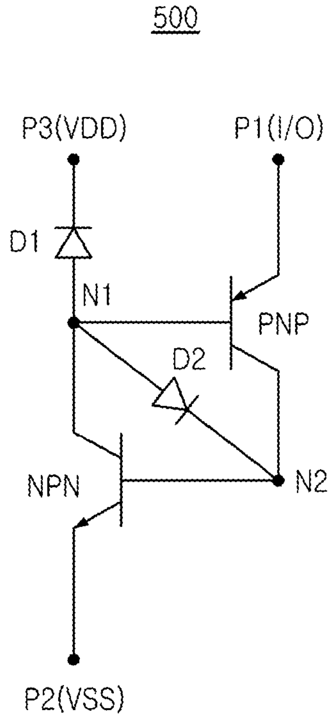
FIG. 19 is a schematic diagram illustrating an ESD protection circuit included in a semiconductor device according to an example embodiment.

FIG. 19 is a schematic diagram illustrating an ESD protection circuit included in a semiconductor device according to an example embodiment.

Referring to FIG. 19, an ESD protection circuit 500 according to an example embodiment may include the PNP transistor PNP, the NPN transistor NPN, the first diode D1, and a second diode D2.

In the same manner as the ESD protection circuit 100 described with reference to FIG. 2, in the ESD protection circuit 500 described with reference to FIG. 19, the emitter of the PNP transistor PNP may be connected to the first pad P1 to which a signal is input or output. In addition, the emitter of the NPN transistor NPN may be connected to the second pad P2 to which a reference voltage is applied. For example, the reference voltage may be a ground voltage VSS. The base of the PNP transistor PNP may be connected to the collector of the NPN transistor NPN. In addition, the collector of the PNP transistor PNP may be connected to the base of the NPN transistor NPN. In addition, the base of the PNP transistor PNP may be connected to the third pad P3 to which the power supply voltage VDD is applied through the first diode D1.

According to an example embodiment, the base of the PNP transistor PNP and the base of the NPN transistor NPN may be electrically connected to each other through the second diode D2. FIG. 19 illustrates the second diode D2 being connected between the first node N1 to which the base of the PNP transistor PNP is connected and a second node N2 to which the base of the NPN transistor NPN is connected.

According to an example embodiment, current caused by static electricity introduced through the first pad P1 may flow to the second pad P2 along the first node N1 and the second node N2, such that an SCR circuit may be triggered. The SCR circuit may be triggered, when a potential difference between the first pad P1 and the second pad P2 is greater than a sum of threshold voltages of a PN junction of the PNP transistor PNP, the second diode D2, and a PN junction of the NPN transistor NPN. That is, a first trigger voltage $V_{T1}$ of the ESD protection circuit 500 of FIG. 19 may be higher than a first trigger voltage $V_{T1}$ of the ESD protection circuit 100 of FIG. 2 by the threshold voltage of the second diode D2. Accordingly, the first trigger voltage $V_{T1}$ may be adjusted by connecting one or more diodes between the base of the PNP transistor PNP and the base of the NPN transistor NPN.

Figure 20:
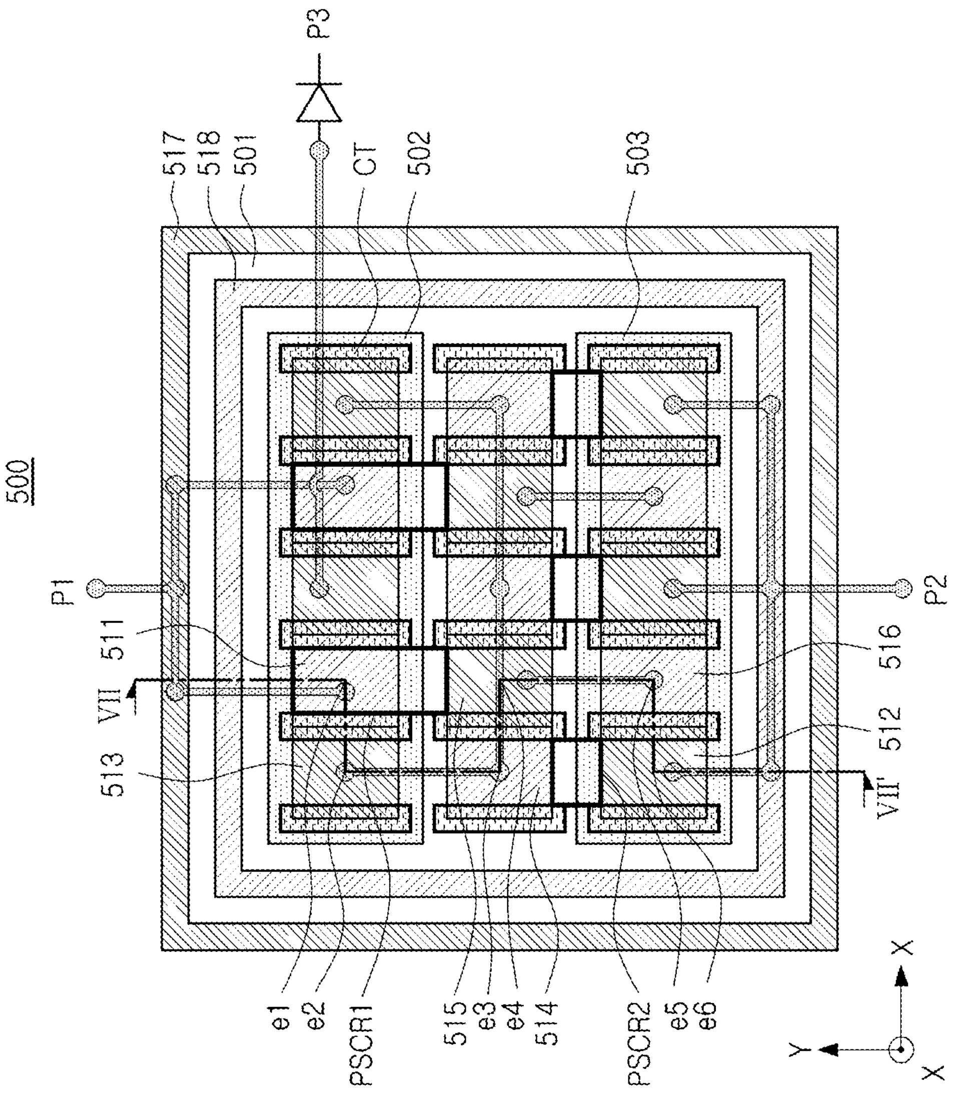
FIG. 20 is a diagram illustrating a structure of an ESD protection circuit included in a semiconductor device according to an example embodiment.
Figure 21:
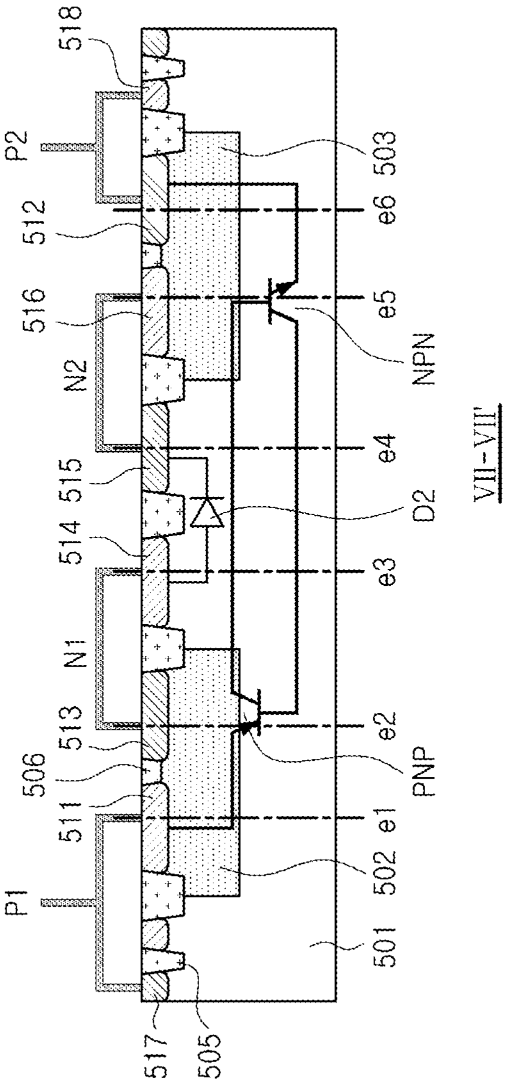
FIG. 21 is a cross-sectional view taken along line VII-VII' of FIG. 20.

FIG. 20 is a diagram illustrating a structure of an ESD protection circuit included in a semiconductor device according to an example embodiment. FIG. 21 is a cross-sectional view taken along line VII-VII' of FIG. 20.

FIGS. 20 and 21 may be one of examples in which the ESD protection circuit 500 of FIG. 19 are implemented. Referring to FIGS. 20 and 21, a first well region 502 and a second well region 503 may be formed in a substrate 501. The substrate 501 may be doped with first conductivity-type impurities, and the first well region 502 and the second well region 503 may be doped with second conductivity-type impurities. Referring to FIG. 20, the first well region 502 and the second well region 503 may extend (e.g., lengthwise) from the substrate 501 in the first direction X, and may be spaced apart from each other in the second direction Y.

Referring to FIGS. 20 and 21, in each of the substrate 501, the first well region 502, and the second well region 503, a plurality of active regions 511 to 516 and element isolation films 505 and 506, isolating the plurality of active regions 511 to 516 from each other, may be formed. First, fourth, and sixth active regions 511, 514, and 516 may be doped with the first conductivity-type impurities, and may have an impurity concentration higher than that of the substrate 501. Second, third, and fifth active regions 512, 513, and 515 may be doped with the second conductivity-type impurities, and may have an impurity concentration higher than that of the first and second well regions 502 and 503.

Referring to FIG. 20, the first active regions 511 and the third active regions 513 may be alternately disposed in the first well region 502 in the first direction X, and the second active regions 512 and the sixth active regions 516 may be alternately disposed in the second well region 503 in the first direction X. In addition, the fourth active regions 514 and the fifth active regions 515 may be alternately disposed in a region defined between the first well region 502 and the second well region 503 of the substrate 501 in the first direction X.

Referring to FIGS. 20 and 21, a first element isolation film 505 may be formed in a region in which the substrate 501, the first well region 502, and the second well region 503 are illustrated in FIG. 20. In addition, a second element isolation film 506 may be formed in a cut region CT illustrated between the first active regions 511 and the third active regions 513, the second active regions 512 and the sixth active regions 516, and the fourth active regions 514 and the fifth active regions 515.

Referring to FIG. 20, the ESD protection circuit 500 may further include guard rings 517 and 518 surrounding the plurality of active regions 511 to 516. A first guard ring 517 may be doped with the second conductivity-type impurities, and a second guard ring 518 may be doped with the first conductivity-type impurities.

According to an example embodiment, the first active regions 511, the first well region 502, the substrate 501, and the second well region 503 may form a PNPN junction, thereby forming an SCR circuit. FIG. 20 illustrates first partial SCR regions PSCR1 formed by the first active region 511, the first well region 502 and the substrate 501, and second partial SCR regions PSCR2 formed by the substrate 501 and the second well region 503. The first partial SCR regions PSCR1 and the second partial SCR regions PSCR2 are illustrated as being isolated from each other in FIG. 20. However, the first partial SCR regions PSCR1 and the second partial SCR regions PSCR2 may be electrically connected to each other through the substrate 501, thereby forming a single SCR circuit.

Referring to FIG. 21, the first active region 511 may provide an emitter of a PNP transistor PNP. In addition, a base of the PNP transistor PNP may be provided by the first well region 502, and a collector of the PNP transistor PNP may be provided by the substrate 501. The emitter of the PNP transistor PNP may be connected to a first pad P1.

The second well region 503 may provide an emitter of an NPN transistor NPN. In addition, a base of the NPN transistor NPN may be provided by the substrate 501, and a collector of the NPN transistor NPN may be provided by the first well region 502. An emitter of the NPN transistor may be connected to a second pad P2.

According to an example embodiment, the fourth active region 514 may provide an anode of a second diode D2, and the fifth active region 515 may provide a cathode of the second diode D2. The third active region 513 and the fourth active region 514 may be electrically connected to each other by an interconnection pattern. In addition, the fifth active region 515 and the sixth active region 516 may also be electrically connected to each other by an interconnection pattern. The anode of the second diode D2 may be electrically connected to the base of the PNP transistor PNP through an electrical connection between the third active region 513 and the fourth active region 514. In addition, the cathode of the second diode D2 may be electrically connected to the base of the NPN transistor NPN through an electrical connection between the fifth active region 515 and the sixth active region 516.

According to an example embodiment, a first trigger voltage $V_{T1}$ may be controlled by connecting the second diode D2 between the base of the PNP transistor PNP and the base of the NPN transistor NPN.

According to an example embodiment, a base of a PNP transistor of an ESD protection circuit may be electrically connected to a base of an NPN transistor using an interconnection pattern or the like, such that the ESD protection circuit may be triggered before a potential difference between ESD applied to an input/output pad and a reference voltage reaches a breakdown voltage level, thereby effectively protecting internal semiconductor elements of a semiconductor device from ESD.

According to an example embodiment, a base of a PNP transistor of an ESD protection circuit may be electrically connected to a power pad, such that ESD applied to an input/output pad may be rapidly removed even through the power pad. In addition, a current path formed from the base of the PNP transistor to the power pad may reduce parasitic capacitance appearing in the input/output pad, thereby effectively transmitting a high-speed input/output signal of a semiconductor device.

By way of summation and review, an aspect of embodiments provides a semiconductor device capable of effectively protecting internal semiconductor elements from ESD by allowing an ESD protection circuit to have a trigger voltage lower than a breakdown voltage level. Another aspect of embodiments provides a semiconductor device capable of effectively protecting internal semiconductor elements from ESD by rapidly turning an ESD protection circuit on. Yet another aspect of embodiments provides a semiconductor device capable of preventing distortion of an input/output signal passing through an ESD protection circuit by reducing parasitic capacitance caused by the ESD protection circuit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate doped with first conductivity-type impurities;

a first well region in the substrate and doped with second conductivity-type impurities, the second conductivity-type impurities being different from the first conductivity-type impurities;

first active regions in the first well region, the first active regions being doped with the first conductivity-type impurities, and being connected to a first pad through a first interconnection pattern;

second active regions outside of the first well region in the substrate, the second active regions being doped with the second conductivity-type impurities, and being respectively connected to a second pad through a second interconnection pattern;

third active regions around the first active regions in the first well region and doped with the second conductivity-type impurities; and fourth active regions around the second active regions outside the first well region and doped with the first conductivity-type impurities, wherein at least one of the third active regions and at least one of the fourth active regions are electrically connected to each other through a third interconnection pattern.

2. The semiconductor device as claimed in claim 1, wherein:

the first active regions provide a first emitter of a PNP transistor, the first well region provides a first base of the PNP transistor, and the substrate provides a first collector of the PNP transistor, and the second active regions provide a second emitter of an NPN transistor, the substrate provides a second base of the NPN transistor, and the first well region provides a second collector of the NPN transistor.

3. The semiconductor device as claimed in claim 1, further comprising a first diode connected between at least one of the third active regions and a third pad.

4. The semiconductor device as claimed in claim 3, further comprising a power clamp connected between the third pad and the second pad.

5. The semiconductor device as claimed in claim 1, further comprising:

a second well region in the substrate and doped with the second conductivity-type impurities;

a fifth active region in the second well region and doped with the first conductivity-type impurities; and a sixth active region doped with the second conductivity-type impurities, wherein at least one of the third active regions is connected to the fifth active region through a fourth interconnection pattern, and the fifth active region is connected to the sixth active region through a fifth interconnection pattern.

6. The semiconductor device as claimed in claim 1, wherein:

the first active regions and the third active regions are alternately disposed in a first direction, parallel to an upper surface of the substrate, the second active regions and the fourth active regions are alternately disposed in the first direction, and the first active regions and the second active regions are alternately disposed in a second direction, parallel to the upper surface of the substrate and intersecting the first direction.

7. The semiconductor device as claimed in claim 6, further comprising:

a first element isolation film between the first active regions and the second active regions, and a second element isolation film between the first active regions and the third active regions, and between the second active regions and the fourth active regions.

8. The semiconductor device as claimed in claim 7, wherein the second element isolation film has a length shorter than that of the first element isolation film in a third direction, perpendicular to the upper surface of the substrate.

9. The semiconductor device as claimed in claim 1, further comprising guard rings in the substrate, the guard rings surrounding the first well region, the first active regions, the second active regions, the third active regions, and the fourth active regions.

10. The semiconductor device as claimed in claim 9, further comprising a deep-well region below the first well region, within the substrate, the deep-well region being at least partially in an internal region defined by the guard rings and being doped with the second conductivity-type impurities.

11. The semiconductor device as claimed in claim 1, wherein:

the first active regions and the fourth active regions have an impurity concentration higher than that of the substrate, and the second active regions and the third active regions have an impurity concentration higher than that of the first well region.

12. The semiconductor device as claimed in claim 1, wherein a sum of areas of the first active regions is equal to a sum of areas of the second active regions.

13. The semiconductor device as claimed in claim 1, wherein a sum of areas of the first active regions is different from a sum of areas of the second active regions.

14. A semiconductor device, comprising:

a substrate doped with first conductivity-type impurities;

a first well region and a second well region in the substrate and doped with second conductivity-type impurities, the second conductivity-type impurities being different from the first conductivity-type impurities;

first active regions in the first well region, the first active regions being doped with the first conductivity-type impurities, and being respectively connected to a first pad through a first interconnection pattern;

second active regions in the second well region, the second active regions being doped with the second conductivity-type impurities, and being connected to a second pad through a second interconnection pattern;

third active regions around the first active regions in the first well region and doped with the second conductivity-type impurities;

fourth active regions between the first well region and the second well region in the substrate and doped with the first conductivity-type impurities;

fifth active regions between the first well region and the second well region in the substrate and doped with the second conductivity-type impurities; and sixth active regions around the second active regions in the second well region and doped with the first conductivity-type impurities, wherein at least one of the third active regions and at least one of the fourth active regions are electrically connected to each other through a third interconnection pattern, and wherein at least one of the fifth active regions and at least one of the sixth active regions are electrically connected to each other through a fourth interconnection pattern.

15. The semiconductor device as claimed in claim 14, wherein:

the first active regions provide a first emitter of a PNP transistor, the first well region provides a first base of the PNP transistor, and the substrate provides a first collector of the PNP transistor, and the second well region provides a second emitter of an NPN transistor, the substrate provides a second base of the NPN transistor, and the first well region provides a second collector of the NPN transistor.

16. The semiconductor device as claimed in claim 14, further comprising a first diode connected between at least one of the third active regions and a third pad.

17. A semiconductor device, comprising:

a first pad to which a signal is input and output;

a second pad to which a reference voltage is supplied;

a PNP transistor including a first emitter connected to the first pad, a first collector, and a first base; and an NPN transistor including a second emitter connected to the second pad, a second collector connected to the first base, and a second base connected to the first collector, wherein the first base is connected to the second base and connected to a third pad to which a power supply voltage is supplied through a first diode.

18. The semiconductor device as claimed in claim 17, wherein the first diode includes a plurality of diodes.

19. The semiconductor device as claimed in claim 17, wherein the first base and the second base are connected to each other through a second diode.

20. The semiconductor device as claimed in claim 17, further comprising a power clamp connected between the third pad and the second pad.

* * * * *